(12) United States Patent
Kuroda

(10) Patent No.: US 12,519,487 B2
(45) Date of Patent: Jan. 6, 2026

(54) SEMICONDUCTOR DEVICE

(71) Applicant: ABLIC Inc., Nagano (JP)

(72) Inventor: Tadakatsu Kuroda, Nagano (JP)

(73) Assignee: ABLIC Inc., Nagano (JP)

( * ) Notice: Subject to any disclaimer, the term of this patent is extended or adjusted under 35 U.S.C. 154(b) by 84 days.

(21) Appl. No.: 18/590,903

(22) Filed: Feb. 28, 2024

(65) Prior Publication Data

US 2024/0305282 A1 Sep. 12, 2024

(30) Foreign Application Priority Data

Mar. 9, 2023 (JP) .................. 2023-036680

(51) Int. Cl.
*H03M 9/00* (2006.01)
*H03K 3/037* (2006.01)
*H03K 5/01* (2006.01)
*H03K 5/00* (2006.01)

(52) U.S. Cl.
CPC .............. *H03M 9/00* (2013.01); *H03K 3/037* (2013.01); *H03K 5/01* (2013.01); *H03K 2005/00013* (2013.01)

(58) Field of Classification Search
CPC ..................... H03K 3/037; H03K 5/01; H03K 2005/00013; H03M 9/00
See application file for complete search history.

(56) References Cited

U.S. PATENT DOCUMENTS

2011/0063933 A1* 3/2011 Kubouchi ............ G11C 29/824
365/230.01

FOREIGN PATENT DOCUMENTS

JP H08204582 8/1996
JP 2015154135 8/2015

* cited by examiner

*Primary Examiner* — Patrick O Neill
(74) *Attorney, Agent, or Firm* — JCIPRNET

(57) ABSTRACT

A semiconductor device includes an input port, a pulse generation circuit, and a serial-parallel conversion circuit. The input port is connected to an input port of the pulse generation circuit and a data signal input port of the serial-parallel conversion circuit. A signal received at the input port is a start bit and a data signal. The pulse generation circuit includes a delay circuit. A clock signal output port of the pulse generation circuit is connected to a clock signal input port of the serial-parallel conversion circuit.

11 Claims, 9 Drawing Sheets

SEMICONDUCTOR DEVICE

CROSS-REFERENCE TO RELATED APPLICATION

This application claims the priority benefit of Japan application serial no. 2023-036680, filed on Mar. 9, 2023. The entirety of the above-mentioned patent application is hereby incorporated by reference herein and made a part of this specification.

BACKGROUND

Technical Field

The present invention relates to a semiconductor device including a serial-parallel conversion circuit.

Related Art

A signal input part of a serial-parallel conversion circuit is known to include a clock synchronous input circuit and an asynchronous input circuit.

The clock synchronous input circuit requires a signal line for sending a clock signal in addition to a signal line for sending information, but does not require a clock oscillator of an accurate frequency on the receiving side (serial-parallel conversion circuit side). The asynchronous input circuit does not require a signal line for sending a clock signal, but requires a clock oscillator of an accurate frequency on the receiving side.

SUMMARY

A semiconductor device according to an embodiment of the present invention includes an input port, a pulse generation circuit, and a serial-parallel conversion circuit. The input port is connected to a data input port of the serial-parallel conversion circuit and an input port of the pulse generation circuit. A signal received at the input port is a start bit and a data signal. The pulse generation circuit includes a delay circuit. An output port of the pulse generation circuit is connected to a clock signal input port of the serial-parallel conversion circuit.

According to the present invention, it is possible to provide a semiconductor device including a serial-parallel conversion circuit which does not require a signal line for sending a clock signal and does not require an oscillator of an accurate frequency.

DESCRIPTION OF EMBODIMENTS

Embodiments of the present invention provide a semiconductor device including a serial-parallel conversion circuit which does not require a signal line for sending a clock signal and does not require an oscillator of an accurate frequency.

Hereinafter, a semiconductor device according to embodiments of the present invention will be described with reference to the drawings.

[First Embodiment]

Figure 1:
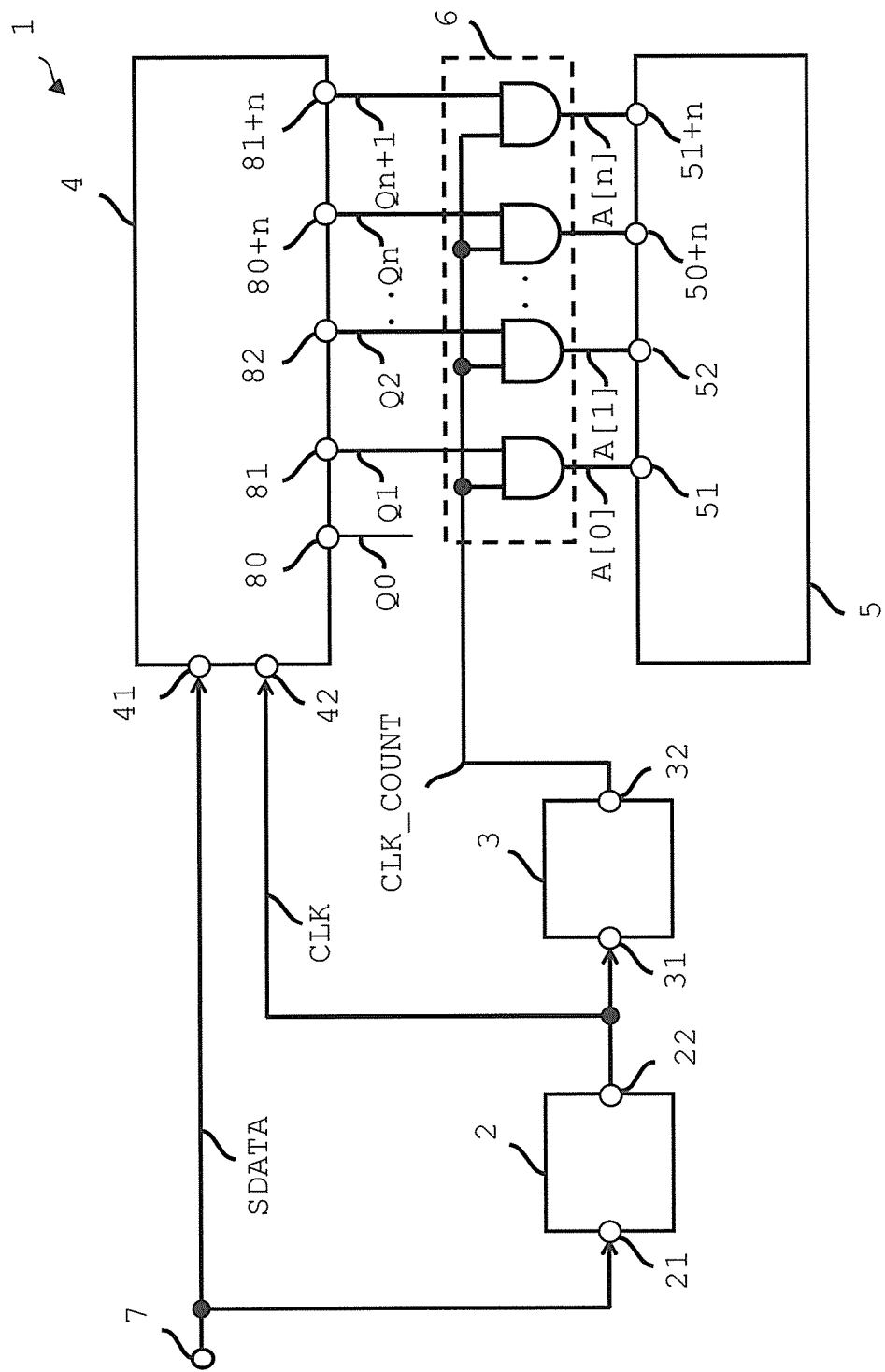
FIG. 1 is a block diagram of a semiconductor device according to a first embodiment of the present invention.

FIG. 1 is a block diagram of a semiconductor device including a serial-parallel conversion circuit according to a first embodiment. A semiconductor device 1 includes an input port 7, a serial-parallel conversion circuit 4, a one-shot pulse generation circuit 2, a gate circuit control signal generation circuit 3, a gate circuit 6, and a fuse circuit 5.

The one-shot pulse generation circuit 2 includes an input port 21 and a clock signal output port 22. The gate circuit control signal generation circuit 3 includes a clock signal input port 31 and a CLK_COUNT output port 32. The serial-parallel conversion circuit 4 includes a data signal input port 41, a clock signal input port 42, a Q0 output port 80, a Q1 output port 81, a Q2 output port 82, and, depending on the number of bits of output, a Qn output port 80+n and a Qn+1 output port 81+n. The fuse circuit 5 includes an A [0] input port 51, an A [1] input port 52, and, depending on the number of bits of input, an A [n-1] input port 50+n and an A [n] input port 51+n. The gate circuit 6 includes AND circuits in a number corresponding to the number of bits of input of the fuse circuit 5.

Figure 3:
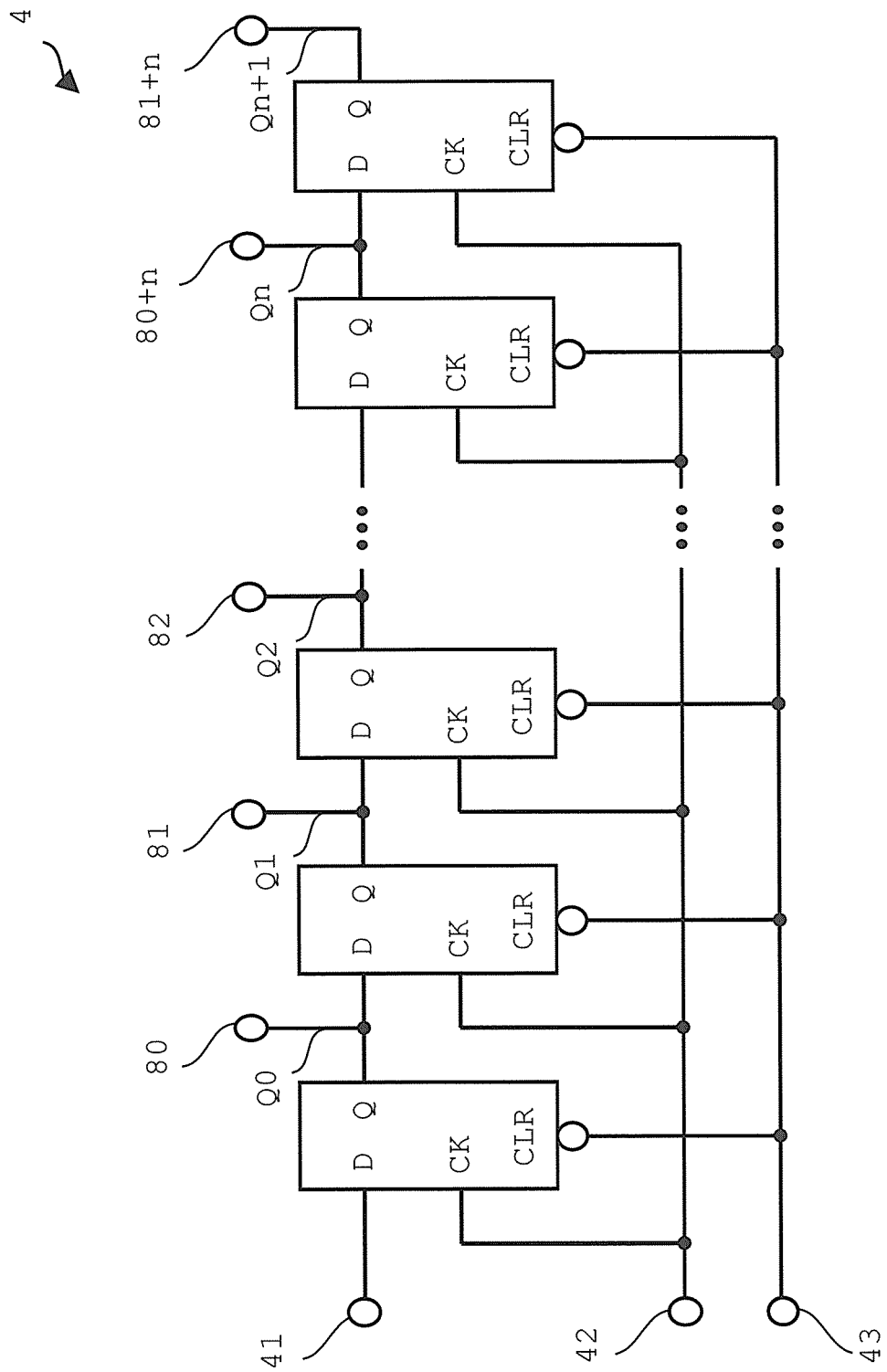
FIG. 3 is a circuit diagram of a serial-parallel conversion circuit according to the first embodiment of the present invention.

With reference to FIG. 3, the configuration of the serial-parallel conversion circuit 4 will be described. The serial-parallel conversion circuit 4 includes D-type flip-flops in a number corresponding to the number of bits of output. A clear signal input port 43 is connected to CLR input ports of all these D-type flip-flops. The clock signal input port 42 is connected to CK input ports of all these D-type flip-flops. The data signal input port 41 is connected only to the D input port of the initial-stage D-type flip-flop. The Q0 output port 80 is connected to the Q output port of the initial-stage D-type flip-flop and, at the same time, is connected to the D input port of the second-stage D-type flip-flop. The Q1 output port 81 is connected to the Q output port of the second-stage D-type flip-flop and, at the same time, is connected to the D input port of the third-stage D-type flip-flop. The Q2 output port 82 is connected to the Q output port of the third-stage D-type flip-flop and, at the same time, is connected to the D input port of the next D-type flip-flop. The Qn output port 80+n is connected to the Q output port of the (n+1) th-stage D-type flip-flop and, at the same time, is connected to the D input port of the next D-type flip-flop.

The Qn+1 output port 81+n is only connected to the Q output port of the (n+2) th-stage D-type flip-flop.

Figure 4:
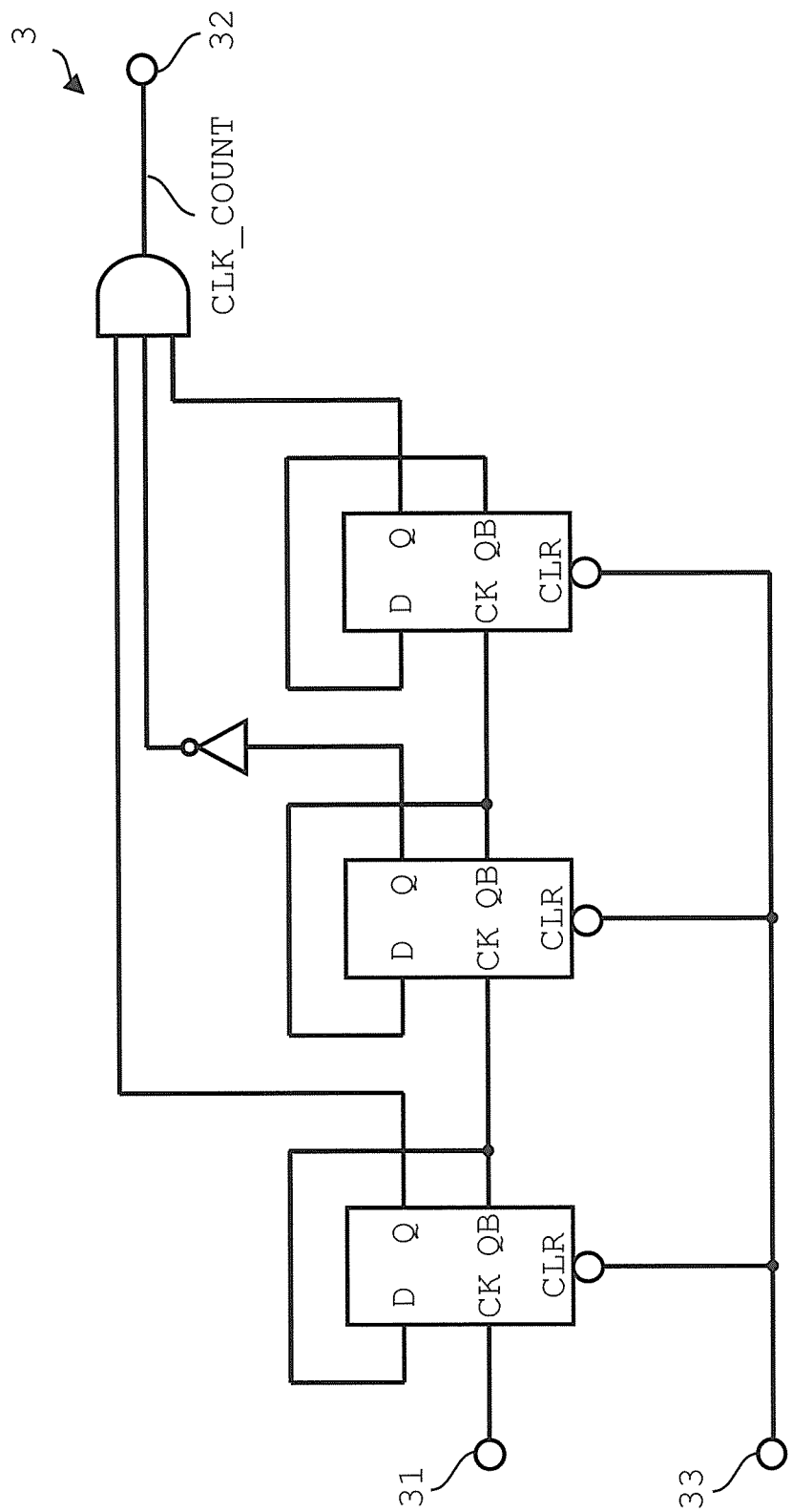
FIG. 4 is a circuit diagram of a gate circuit control signal generation circuit according to the first embodiment of the present invention.

With reference to FIG. 4, the configuration of the gate circuit control signal generation circuit 3 will be described. The gate circuit control signal generation circuit 3 includes D-type flip-flops in a number allowing for counting a desired number, a NOT circuit, and an AND circuit. A clear signal input port 33 is connected to CLR input ports of all these D-type flip-flops. The clock signal input port 31 is connected to the CK input port of only the initial-stage D-type flip-flop. The CLK_COUNT output port 32 is connected to the output port of the AND circuit including input ports in a number equal to the number of the D-type flip-flops in the gate circuit control signal generation circuit 3. The NOT circuit is disposed as necessary between the input ports of the AND circuit connected to the CLK_COUNT output port 32 and the Q output ports of the plurality of D-type flip-flops included in the gate circuit control signal generation circuit 3. Specifically, in the case where the CLK_COUNT output port 32 is set to active logic in a period in which the count value is 5, 5 in decimal is 101 in binary. One NOT circuit is applied to the middle bit of the three bits, that is, to the second bit. In this embodiment, the input port of the NOT circuit is connected to the Q output port of the second-bit D-type flip-flop of the gate circuit control signal generation circuit 3, and the output port of the NOT circuit is connected to the input port of the AND circuit of which the output port is connected to the CLK_COUNT output port 32. Also, the Q output ports of the first-bit and third-bit D-type flip-flops of the gate circuit control signal generation circuit 3 are respectively directly connected to the input ports of the AND circuit of which the output port is connected to the CLK_COUNT output port 32. To put it simply, a simple decoder is configured with the AND circuit and the NOT circuit.

The gate circuit control signal generation circuit 3 of this embodiment adopts a form called a ripple counter as a binary counter. The QB output ports of all the D-type flip-flops of the gate circuit control signal generation circuit 3 are respectively directly connected to their own D input ports. The QB output port of the initial-stage (i.e., first bit) D-type flip-flop is directly connected to the CK input port of the second-stage (i.e., second bit) D-type flip-flop. The QB output port of the second-stage D-type flip-flop is directly connected to the CK input port of the third-stage (i.e., third bit) D-type flip-flop. The gate circuit control signal generation circuit 3 is configured using a binary counter and a decoder in this manner.

Figure 6:
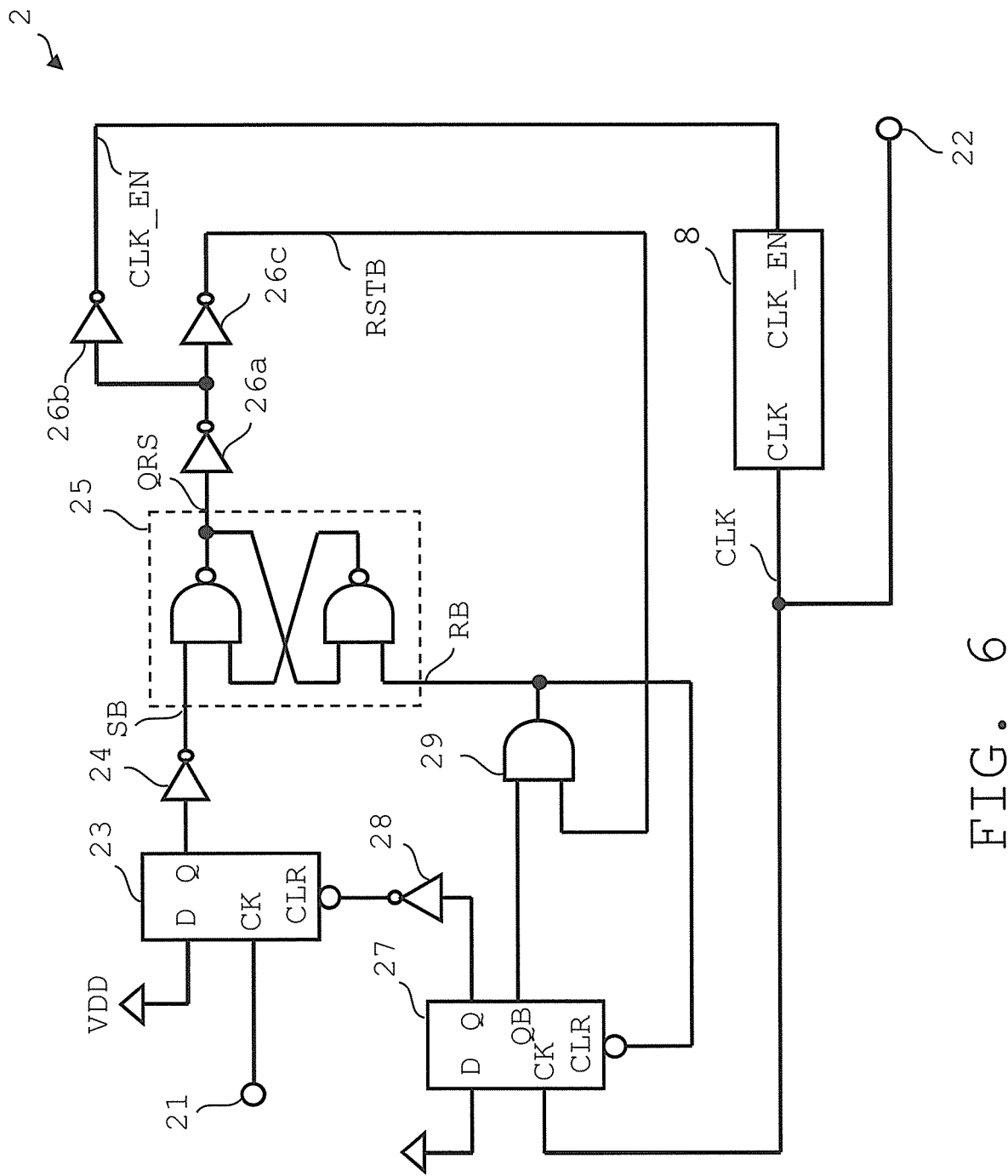
FIG. 6 is a circuit diagram of a one-shot pulse generation circuit according to the first embodiment of the present invention.
Figure 7:
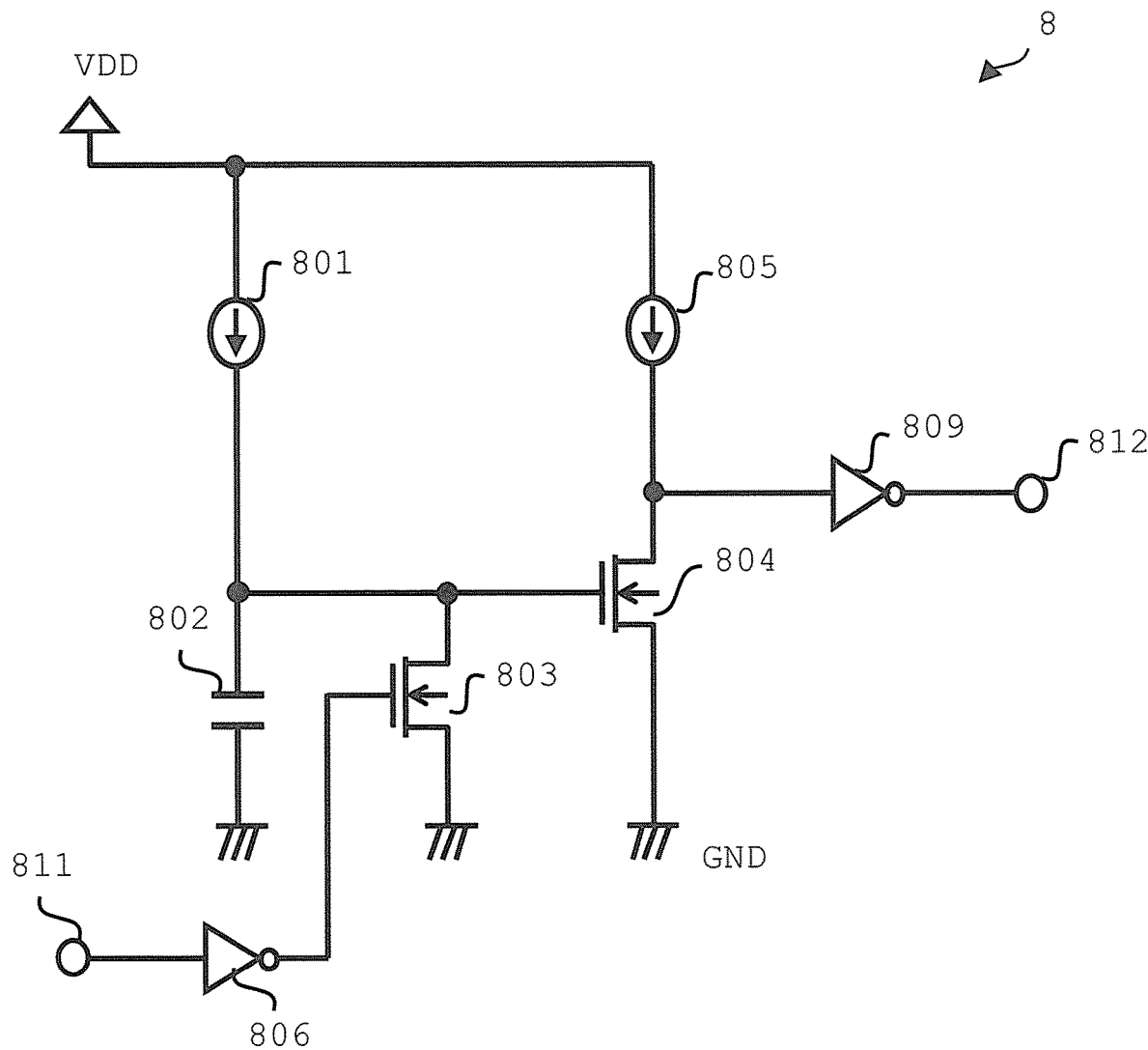
FIG. 7 is a circuit diagram of a delay circuit according to the first embodiment of the present invention.

With reference to FIG. 6 and FIG. 7, the internal structure of the one-shot pulse generation circuit 2 will be described. Since there are extremely many methods for implementing the one-shot pulse generation circuit 2, it would be sufficient to adopt an optimal implementation method according to actual circumstances. Herein, as illustrated in FIG. 6, the one-shot pulse generation circuit 2 is composed of two D-type flip-flops 23 and 27, one set of an RS latch 25, five NOT circuits 24, 26a, 26b, 26c, and 28, one AND circuit 29, and one delay circuit 8. The RS latch 25 herein is of a standard type composed of two two-input NAND circuits.

The internal connections of the one-shot pulse generation circuit 2 will be described. The input port 21 is connected to the CK input port of the D-type flip-flop 23. (Hereinafter, the D-type flip-flop 23 will be abbreviated as FF1.) The D input port of FF1 is connected to a power supply VDD. The CLR input port of FF1 is connected to the output port of the NOT circuit 28. The Q output port of FF1 is connected to the input port of the NOT circuit 24. The output port of the NOT circuit 24 is connected to the SB input port of the RS latch 25. The QRS output port of the RS latch 25 is connected to the input port of the NOT circuit 26a. The output port of the NOT circuit 26a is connected to the input port of the NOT circuit 26b and the input port of the NOT circuit 26c. The output port of the NOT circuit 26b is connected to a CLK_EN input port 811 of the delay circuit 8. A CLK output port 812 of the delay circuit 8 is connected to the clock signal output port 22 and the CK input port of the D-type flip-flop 27. (Hereinafter, the D-type flip-flop 27 will be abbreviated as FF2.) The D input port of FF2 is connected to the power supply VDD. The Q output port of FF2 is connected to the input port of the NOT circuit 28. The QB output port of FF2 is connected to the first input port of the AND circuit 29. The second input port of the AND circuit 29 is connected to the output port of the NOT circuit 26c. The output port of the AND circuit 29 is connected to the CLR input port of FF2 and the RB terminal of the RS latch 25.

Furthermore, since there are extremely many methods for implementing the delay circuit 8, it would be sufficient to adopt an optimal method according to actual circumstances. As illustrated in FIG. 7, herein, the delay circuit 8 is composed of one capacitor 802, two enhancement-type N-channel MOS transistors 803 and 804, two constant current elements 801 and 805, and two NOT circuits 806 and 809.

The internal connections of the delay circuit 8 will be described. The first terminal of the constant current element 801 and the first terminal of the constant current element 805 are connected to the power supply VDD. The second terminal of the constant current element 801 is connected to the first terminal of the capacitor 802, the drain terminal of the enhancement-type N-channel MOS transistor 803, and the gate terminal of the enhancement-type N-channel MOS transistor 804. The second terminal of the constant current element 805 is connected to the drain terminal of the enhancement-type N-channel MOS transistor 804 and the input port of the NOT circuit 809. The second terminal of the capacitor 802, the source terminal of the enhancement-type N-channel MOS transistor 803, and the source terminal of the enhancement-type N-channel MOS transistor 804 are all connected to ground GND. The CLK_EN input port 811 is connected to the input port of the NOT circuit 806. The output port of the NOT circuit 806 is connected to the gate terminal of the enhancement-type N-channel MOS transistor 803. The output port of the NOT circuit 809 is connected to the CLK output port 812.

These components are not special components but are common components. Thus, descriptions of the operation herein will be kept to a minimum. For example, since a power-on clear circuit to be described later is common art to those skilled in the art, detailed description and illustration thereof will be omitted below. It is assumed that the clear period of a power-on clear circuit (not illustrated) in the semiconductor device 1 has a desired length. Then, in FIG. 6, each signal of CLK_EN and RSTB, and CLK, which is the signal of the clock signal output port 22, are low level as the initial state. Similarly, in FIG. 6, FF1 and FF2 are also in a clear state as the initial state. Upon change of the signal received at the input port 21 from low level to high level, since the Q output port of FF1 becomes high level, the QRS output port outputting from the upper side of the RS latch outputs high level, and CLK_EN and RSTB become high level. From the timing at which the CLK_EN changes to high level, delayed for a delay time provided by the delay circuit 8, the CK input port of FF2 becomes high level. Since the D input port of FF2 is also high level, in response to the CK input port becoming high level, FF2 is set. At the same time, FF1, which is located at the end of a connection from the Q output port of FF2, is cleared, and since the QB output port of FF2 is low level, low level is received at the RB input port on the lower side of the RS latch. Thus, since the input of the SB input port on the upper side of the RS latch is inverted and outputted, the QRS output port on the upper side of the RS latch returns to low level. Also, at the same time, the CLR input port of FF2 becomes low level, and since this port is a negative logic input port, FF2 is cleared. At the same time, CLK_EN and RSTB return to low level and become a stable state.

The delay circuit 8 in this embodiment will be briefly described. The specific operation of the delay circuit 8 is as follows. That is, the rise in a potential V1 of the first terminal of the capacitor 802 immediately after the CLK_EN input port 811 changes from low level to high level is a potential rise obtained by charging the capacitor 802 with a current I1 flowed by the constant current element 801 because the enhancement-type N-channel MOS transistor 803 is off. Since the current I1 is a constant value, it takes a specified amount of time to charge the capacitor 802. Conversely, if the CLK_EN input port 811 drops to low level, the enhancement-type N-channel MOS transistor 803 turns on, and since the charge of the capacitor 802 is rapidly released, the potential V1 almost immediately becomes close to zero volts. The signal obtained by waveform-shaping the potential V1 to a pulse waveform is outputted to CLK from the CLK output port 812. Herein, a delay time of the CLK output port 812 from when the CLK_EN input port 811 changes to high level to when the CLK output port 812 changes from low level to high level will be referred to as a first delay time dlt1 below. Further, immediately thereafter, a delay time of the CLK output port 812 until changing from high level to low level will be referred to as a second delay time dlt2.

After going through the series of operations described above, the one-shot pulse generation circuit 2 which has generated one pulse returns to the initial state. In practice, any circuit may be adopted as long as it is a circuit capable of generating such a pulse.

In this embodiment, a fuse circuit 5 is also provided. Regarding the fuse inside the fuse circuit 5, the fuse in the bit in which the input port becomes active logic blows. The active logic is positive logic, that is, high level. The clear signal input port 33 of the gate circuit control signal generation circuit 3 and the clear signal input port 43 of the serial-parallel conversion circuit 4 are connected to a power-on clear circuit (not illustrated) in the semiconductor device 1.

Next, the operation of the semiconductor device 1 will be described. Immediately after power-on, the gate circuit control signal generation circuit 3 and the serial-parallel conversion circuit 4 are in a cleared state due to the power-on clear circuit (not illustrated). Upon receipt of high level at the input port 7, the clock signal output port 22 of the one-shot pulse generation circuit 2 outputs high level after the first delay time dlt1, and thereafter, outputs low level after the second delay time dlt2. In other words, the one-shot pulse generation circuit 2 generates one positive polarity pulse which serves as a clock signal and a strobe signal inside the semiconductor device 1 and outputs the pulse to CLK.

If the signal of the input port 7 is low level at the time of rise of CLK, the initial-stage D-type flip-flop of the serial-parallel conversion circuit 4 recognizes that low level has arrived. That is, 0 is captured. Conversely, if the signal of the input port 7 is high level at the time of rise of CLK, the initial-stage D-type flip-flop of the serial-parallel conversion circuit 4 recognizes that high level has arrived. That is, 1 is captured. Due to the connection relationship described above, the CK input ports of all the D-type flip-flops inside the serial-parallel conversion circuit 4 receive CLK generated by the one-shot pulse generation circuit 2. That is, focusing on the data recognized by the initial-stage D-type flip-flop described above, the data shifts sequentially as in a commonly known serial-parallel conversion circuit. That is, the data becomes parallel data.

On the other hand, the gate circuit control signal generation circuit 3 is counting CLK generated by the one-shot pulse generation circuit 2. In this embodiment, if counting to 5, active logic is outputted to the CLK_COUNT output port 32. The active logic is positive logic, that is, high level. The number of output ports of the serial-parallel conversion circuit 4 in this embodiment is 5. Thus, "the CLK_COUNT output port 32 becoming active logic as described above" means that serial-parallel conversion has just been completed. All the first input ports of the respective AND circuits of the gate circuit 6 are connected to the CLK_COUNT output port 32. The second input ports are connected to the respective output ports of the serial-parallel conversion circuit 4. The output ports of the respective AND circuits are connected to the respective input ports of the fuse circuit 5 corresponding to the respective output ports of the serial-parallel conversion circuit 4. In this embodiment, the correspondence between the respective output ports of the serial-parallel conversion circuit 4 and the respective input ports of the fuse circuit 5 includes four sets as follows. A first set includes the Q1 output port 81 and the A[0] input port 51 corresponding to each other. A second set includes the Q2 output port 82 and the A[1] input port 52 corresponding to each other. A third set includes the Qn output port 80+n and the A[n-1] input port 50+n corresponding to each other. A fourth set includes the Qn+1 output port 81+n and the A[n] input port 51+n corresponding to each other. Herein, the Q0 output port 80 is left open.

As configured above, in response to the CLK_COUNT output port 32 becoming active logic, each output data of the serial-parallel conversion circuit 4 which has just completed the serial-parallel conversion is respectively transmitted to each input port of the fuse circuit 5. That is, it is possible to blow the desired fuse.

The period in which the CLK_COUNT output port 32 is active logic will be described. In the case of this embodiment, the time starting to become active logic is when the count value of the one-shot pulse generation circuit 2 becomes 5 as described above. On the other hand, the time returning from active logic to inactive logic is when the count value of the one-shot pulse generation circuit 2 becomes 6. The time the inside of the gate circuit control signal generation circuit 3 counts up is when the clock signal input port 31 changes from low level to high level. Since the one-shot pulse generation circuit 2 is provided between the input port 7 and the clock signal input port 31 due to the connection relationship described above, the time the clock signal input port 31 changes from low level to high level is after elapse of the first delay time dlt1 after the input port 7 changes from low level to high level. In the case of this embodiment, the time the CLK_COUNT output port 32 changes from low level to high level is after elapse of the first delay time dlt1 after the input port 7 changes from low level to high level for the fifth time. Conversely, in the case of this embodiment, the time the CLK_COUNT output port 32 changes from high level to low level is after elapse of the first delay time dlt1 after the input port 7 changes from low level to high level for the sixth time. Specifically, it is assumed that the first delay time dlt1 creates an increment of, for example, 1 microsecond due to manufacturing variations. In this case, the timing at which the CLK_COUNT output port 32 changes from low level to high level has a delay of this 1 microsecond. On the other hand, the time the CLK_COUNT output port 32 changes from high level to low level similarly has a delay of this 1 microsecond. That is, both are delayed equally. Thus, since the length itself of the period in which the CLK_COUNT output port 32 remains high level depends only on the interval of the rise of the signal received at the input port 7, the length is irrelevant to the increase or decrease of the first delay time dlt1.

Figure 2:
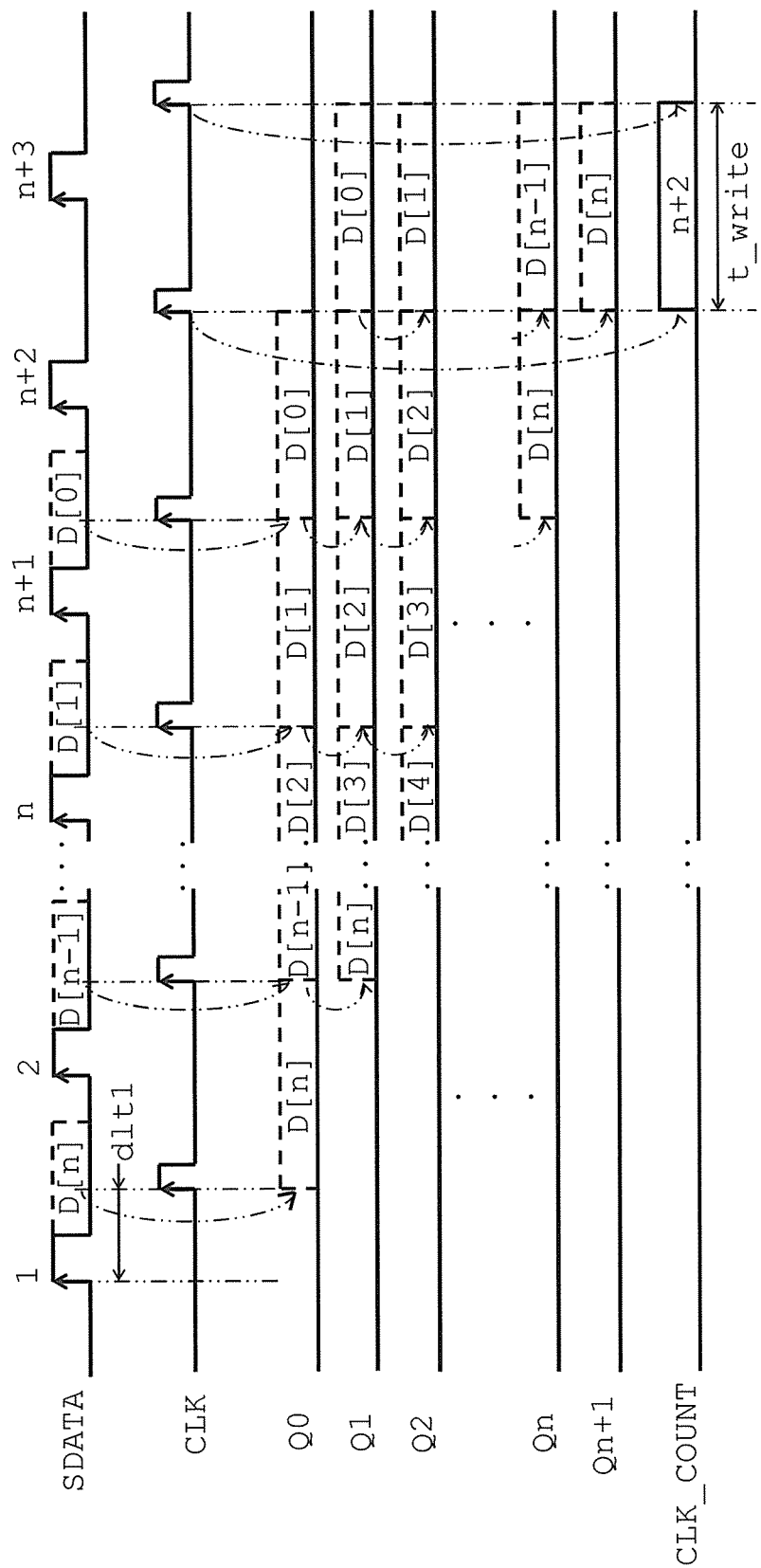
FIG. 2 is a timing chart of the semiconductor device according to the first embodiment of the present invention.

The timing chart of FIG. 2 illustrates the overall operation. The horizontal axis represents time. The vertical axis represents level (potential). A plurality of signals are vertically arranged and illustrated. SDATA in FIG. 2 is a signal received at the input port 7. Similarly, CLK in the figure is a signal outputted from the clock signal output port 22 of the one-shot pulse generation circuit 2. Q0 to Qn+1 are respective output signals of the serial-parallel conversion circuit 4. CLK_COUNT is a signal outputted from the CLK_COUNT output port 32 of the gate circuit control signal generation circuit 3. In the case of this embodiment, in the input waveform of the input port 7, a continuation of a start bit and a data bit may be regarded as one unit. "dlt1" in the figure is the first delay time dlt1. Each time the input port changes from low level to high level, one positive polarity pulse is generated and outputted on CLK after this delay time. In the figure, assuming n=3, each time this pulse of CLK occurs, the value of Qn moves to Qn+1, the value of Q2 moves to Qn, the value of Q1 moves to Q2, and the value of Q0 moves to Q1, respectively. At this time, if SDATA is low level when CLK changes from low level to high level, the value of Q0 becomes 0. Conversely, if SDATA is high level when CLK changes from low level to high level, the value of Q0 becomes 1. Under this assumption of n=3, n+2, that is, after elapse of the first delay time dlt1 after the input port changes from low level to high level for the fifth time, CLK_COUNT becomes active logic. Then, it returns to inactive logic at the sixth time. That is, the period of active logic of the CLK_COUNT becomes a fuse write time t_write.

Figure 5:
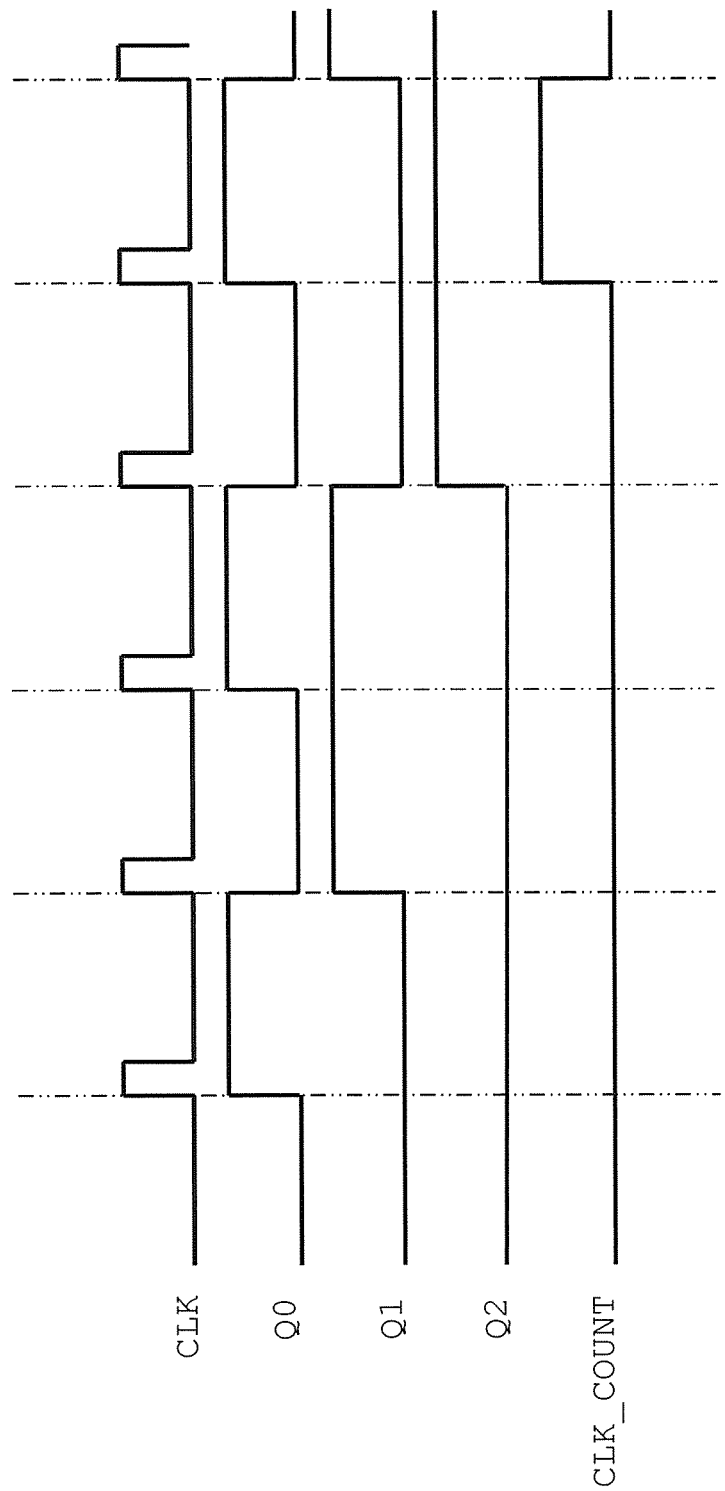
FIG. 5 is a timing chart of the gate circuit control signal generation circuit according to the first embodiment of the present invention.

FIG. 5 illustrates counting of the gate circuit control signal generation circuit 3. In this figure, the horizontal axis represents time. Similarly, the vertical axis represents level (potential). A plurality of signals are vertically arranged and illustrated. CLK is a signal provided to the clock signal input port 31. Q0 to Q2 are counts inside the gate circuit control signal generation circuit 3. CLK_COUNT is a signal outputted from the CLK_COUNT output port 32 of the gate circuit control signal generation circuit 3. That is, in the period in which the count value is 5, CLK_COUNT becomes active logic. Also, during the fuse write time t_write, in this embodiment, the desired fuse blows.

As described above, according to the configuration example of this embodiment, it is possible to provide a semiconductor device including a serial-parallel conversion circuit which does not require a signal line for sending a clock signal from outside and does not require an oscillator of an accurate frequency. Following the relationship of the delay time of a period in which the CLK_COUNT output port 32 remains high level, during the time waiting for fuse blowing in the fuse circuit 5, the overall circuit operation can be controlled according to the waveform of the signal received at the input port 7. This is particularly important in the case of using resistance change type fuses instead of fuses which blow simply. Thus, the first delay time dlt1 can allow for predetermined manufacturing variations. That is, in this aspect as well, it is possible to reduce manufacturing costs.

Overall, it is not required to provide an accurate clock oscillation circuit which causes an increase in manufacturing costs, and it is not required to provide ports for clock input-output with respect to outside the semiconductor device, either. That is, it is possible to provide a semiconductor device at a relatively low cost. This is not due to the number of bits described above, the distinction between a synchronous design and an asynchronous design, or the distinction between a standard logic circuit and an individual vibrator circuit.

[Second Embodiment]

Figure 8:
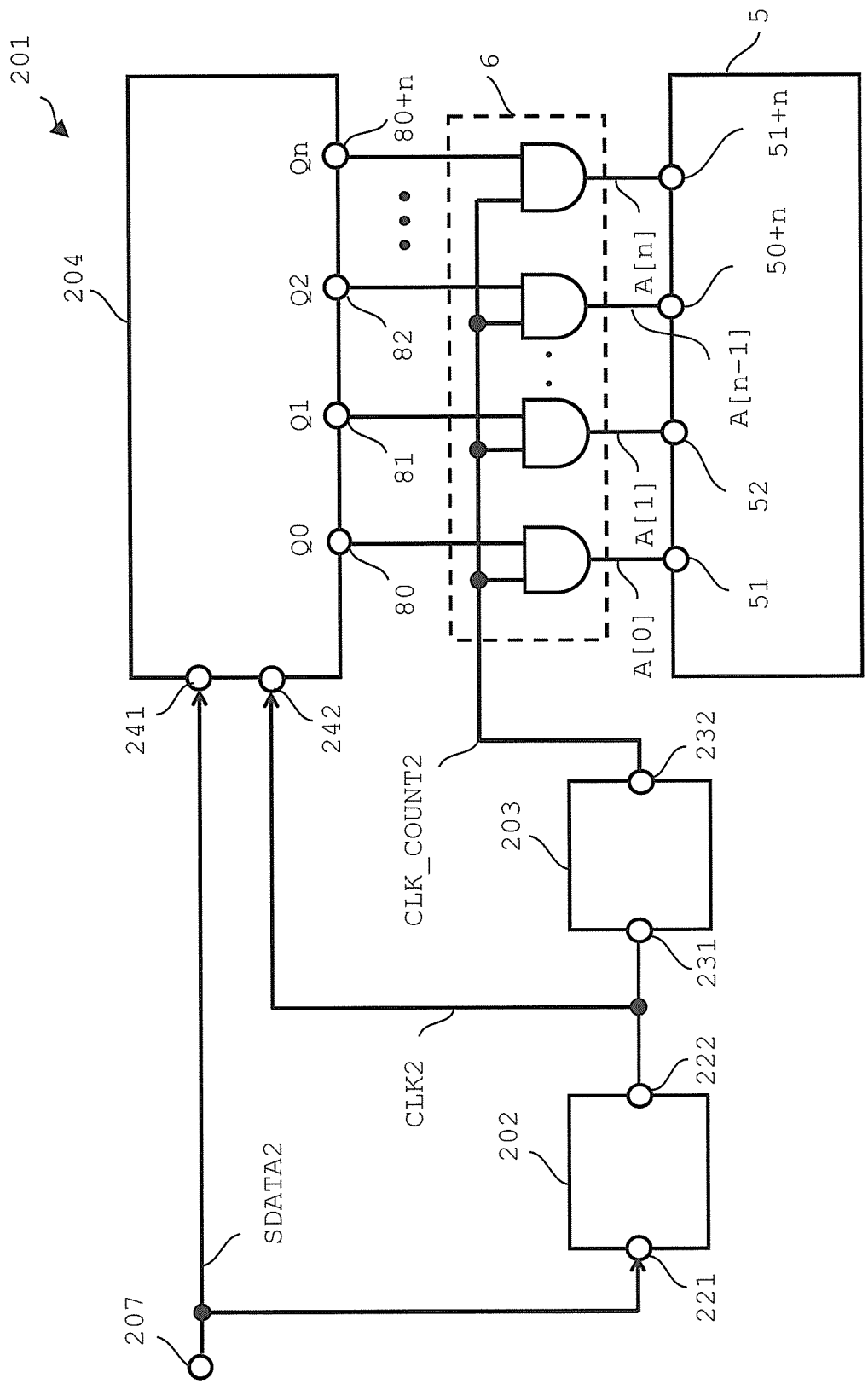
FIG. 8 is a block diagram of a semiconductor device according to a second embodiment of the present invention.

FIG. 8 illustrates a configuration example of a semiconductor device 201 according to a second embodiment. The semiconductor device 201 includes an input port 207, a serial-parallel conversion circuit 204, a double pulse generation circuit 202, a gate circuit control signal generation circuit 203, a gate circuit 6, and a fuse circuit 5.

The double pulse generation circuit 202 includes an input port 221 and a clock signal output port 222. The serial-parallel conversion circuit 204 includes a data signal input port 241, a clock signal input port 242, a Q0 output port 80, a Q1 output port 81, a Q2 output port 82, and, depending on the number of bits of output, a Qn output port 80+n. The difference from the first embodiment only lies in that the number of output ports, i.e., the number of bits of output, is reduced by one bit from the serial-parallel conversion circuit 4.

The input port 207 is connected to the input port 221 and the data signal input port 241. The clock signal output port 222 of the double pulse generation circuit 202 is connected to the clock signal input port 242 of the serial-parallel conversion circuit 204.

Next, the operation will be described. In the first embodiment, which is the basis of the second embodiment, in the input waveform of the input port 7, a continuation of a start bit and a data bit may be regarded as one unit. As another form for implementation, a continuation of one start bit and multiple data bits may be regarded as one unit. The following description of the second embodiment treats a continuation of one start bit and two data bits as one unit.

Upon arrival of a start bit, i.e., a change from low level to high level, at the input port 207, the double pulse generation circuit 202 generates two positive polarity pulses. Specifically, after a change from low level to high level arrives at the input port 207, the clock signal output port 222 changes as follows. That is, after a first delay time dlt1, the clock signal output port 222 becomes high level; after a second delay time dlt2, the clock signal output port 222 becomes low level; after a third delay time dlt3, the clock signal output port 222 becomes high level; and after a fourth delay time dlt4, the clock signal output port 222 becomes low level. Hereafter, CLK2 refers to a signal outputted from the clock signal output port 222.

In the case of sending 4-bit data to the semiconductor device 201 of the case of n =3 (see FIG. 8), the content sent to the input port 207 is time sequentially as follows. That is, in an initial period, a first start bit, D3 (=Dn), and D2 are sent over. In a next period, a second start bit, D1, and D0 are sent over. Specifically, the initial first set will be described. First, the time point at the initial rise of CLK2 after a change from low level to high level arrives at the input port 207 is hereinafter denoted as a time point tp1. If the input port 207 is low level at this time point tp1, the initial-stage D-type flip-flop of the serial-parallel conversion circuit 204 recognizes that low level has arrived. That is, 0 is captured. Conversely, if the signal of the input port 207 is high level at this time point tp1, the initial-stage D-type flip-flop of the serial-parallel conversion circuit 204 recognizes that high level has arrived. That is, 1 is captured. The time point at the next rise of CLK2 is hereafter denoted as a time point tp3. At this time point tp3, if the input port 207 is low level, the initial-stage D-type flip-flop of the serial-parallel conversion circuit 204 recognizes that low level has arrived. That is, 0 is newly captured. Conversely, at this time point tp3, if the signal of the input port 207 is high level, the initial-stage D-type flip-flop of the serial-parallel conversion circuit 204 recognizes that high level has arrived. That is, 1 is newly captured at this time. Similarly, upon arrival of a subsequent one set, the semiconductor device 201 of the second embodiment can receive the value of D1 and the value of D0.

Figure 9:
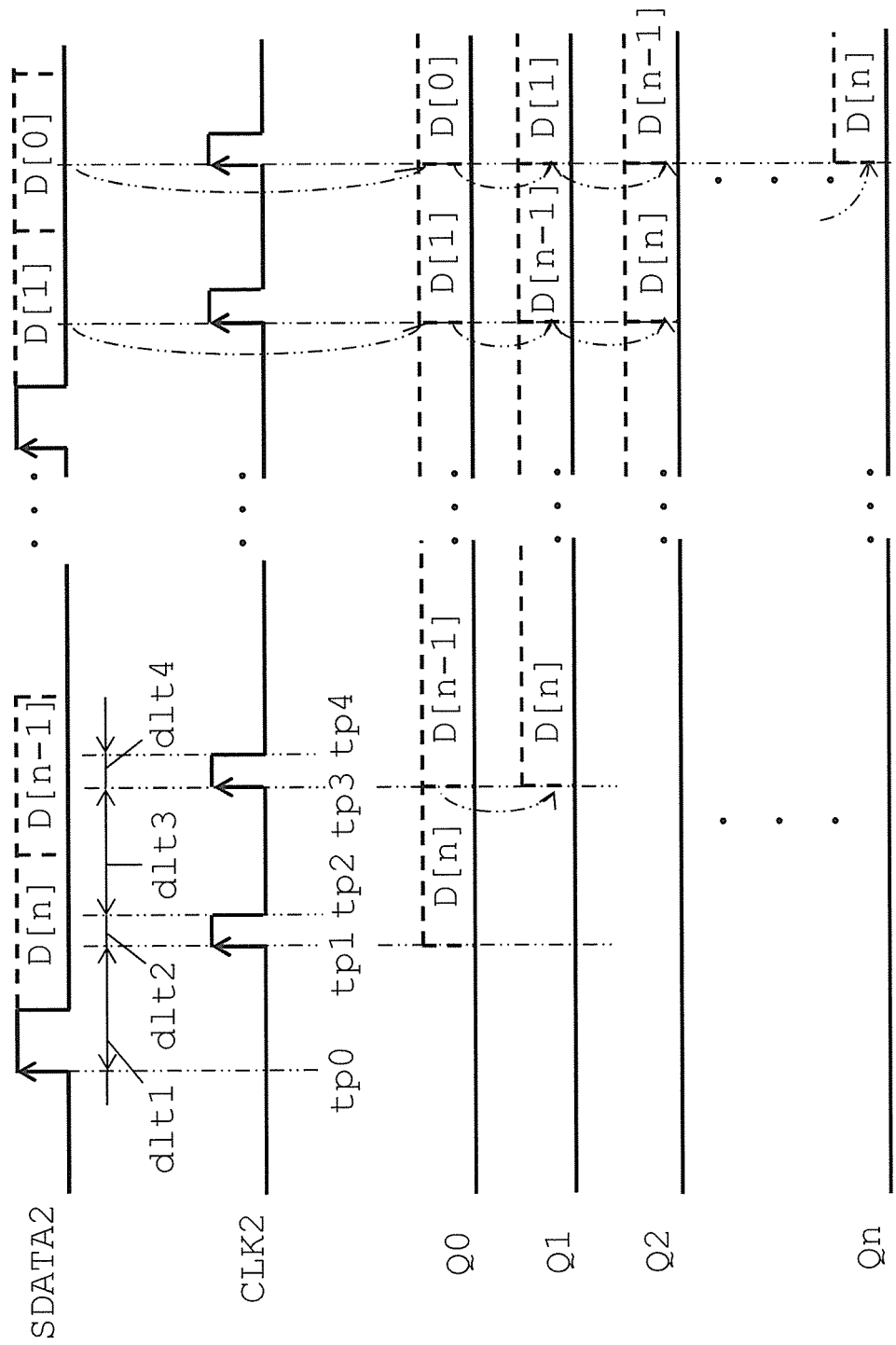
FIG. 9 is a timing chart of the semiconductor device according to the second embodiment of the present invention.

In FIG. 9, the overall operation is illustrated in a timing chart. In this figure, the horizontal axis represents time. Similarly, the vertical axis represents level (potential). A plurality of signals are vertically arranged and illustrated. In this figure, SDATA2 is a signal received at the input port 207. CLK2 is a signal outputted from the clock signal output port 222 of the double pulse generation circuit 202 as described above. It is illustrated that, upon entrance of a signal combining a start bit and data bits to SDATA2, two positive polarity pulses are generated and outputted on CLK2. In this figure, Q0 to Qn are output signals of the serial-parallel conversion circuit 204. The left half of FIG. 9 illustrates that, upon entrance of a first set of a start bit and two data bits to SDATA2, the values of Dn and D2, which eventually become Qn and Q2, are captured. As a shift operation, it is illustrated that the value of Q0 shifts as the value of Q1. The right half of FIG. 9 illustrates that, upon entrance of a second set of a start bit and two data bits to SDATA2, the values of D1 and D0, which eventually become Q1 and Q0, are captured. As a shift operation, it is illustrated that the value of Q2 shifts to Qn, the value of Q1 shifts to Q2, and the value of Q0 shifts as the value of Q1, respectively. That is, the conversion of serial data into parallel data is illustrated.

As described above, according to the configuration example of this embodiment, it is possible to provide a semiconductor device including a serial-parallel conversion circuit which does not require a signal line for sending a clock signal from outside and does not require an oscillator of an accurate frequency. Overall, it is not required to provide an accurate clock oscillation circuit which causes an increase in manufacturing cost, and it is not required to provide ports for clock input-output with respect to outside the semiconductor device, either. In other words, it is possible to provide a semiconductor device at a relatively low cost. This is not due to the number of bits described above, the distinction between a synchronous design and an asynchronous design, or the distinction between a standard logic circuit and an individual vibrator circuit.

The invention is not limited to the embodiments described above. At the implementation stage, the invention may be implemented in various forms other than the embodiments described above and may be subjected to various omissions, additions, replacements, or changes without departing from the spirit of the invention. These embodiments and their modifications are included in the scope and spirit of the invention as well as in the scope of the invention described in the claims and their equivalent ranges.

What is claimed is:

1. A semiconductor device comprising:
   an input port;
   a pulse generation circuit; and
   a serial-parallel conversion circuit,
   a gate circuit control signal generation circuit, wherein
   the input port is connected to a data signal input port of the serial-parallel conversion circuit and an input port of the pulse generation circuit,
   a signal received at the input port is a start bit and a data signal,
   the pulse generation circuit comprises a delay circuit, and
   an output port of the pulse generation circuit is connected to a clock signal input port of the serial-parallel conversion circuit, and
   the output port of the pulse generation circuit is further connected to an input port of the gate circuit control signal generation circuit,
   wherein the gate circuit control signal generation circuit comprises a binary counter and a combination circuit which constitutes a decoder,
   an output port of the binary counter is connected to an input port of the combination circuit which constitutes the decoder, and
   the combination circuit which constitutes the decoder is composed of a logical configuration capable of outputting active logic at a desired count value.

2. The semiconductor device according to claim 1, further comprising:
   a gate circuit; and
   a fuse circuit, wherein
   the gate circuit is connected between the serial-parallel conversion circuit and the fuse circuit.

3. The semiconductor device according to claim 2, wherein the data signal is a 1-bit data signal.

4. The semiconductor device according to claim 2, wherein the pulse generation circuit is a one-shot pulse generation circuit.

5. The semiconductor device according to claim 1, wherein the data signal is a 1-bit data signal.

6. The semiconductor device according to claim 1, wherein the pulse generation circuit is a one-shot pulse generation circuit.

7. The semiconductor device according to claim 1, wherein the binary counter is a ripple counter.

8. The semiconductor device according to claim 1, wherein the pulse generation circuit is configured to, in response to a change of the start bit from a low level to a high level at the input port of the semiconductor device, generate and output multiple positive polarity pulses on a clock output signal.

9. The semiconductor device according to claim 8, wherein
   the clock signal input port of the serial-parallel conversion circuit is configured to receive the clock signal output from the pulse generation circuit, and
   upon an entrance of the signal combining the start bit and data bits to the input port, the serial-parallel conversion circuit is configured to capture values of the data bits in the signal received at the input port at a rising edge of the multiple positive polarity pulses on the clock signal to generate output signals of the serial-parallel conversion circuit.

10. The semiconductor device according to claim 9, wherein a shift operation is performed to shift a value in one of the output signals of the serial-parallel conversion circuit to another one of the output signals of the serial-parallel conversion circuit.

11. The semiconductor device according to claim 8, wherein the pulse generation circuit is a double pulse generation circuit.

\* \* \* \* \*